United States Patent
Nakano et al.

(10) Patent No.: US 10,320,309 B2
(45) Date of Patent: Jun. 11, 2019

(54) SWITCHING DEVICE

(71) Applicant: ROHM CO., LTD., Kyoto (JP)

(72) Inventors: Yuki Nakano, Kyoto (JP); Hiroyuki Sakairi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/853,101

(22) Filed: Dec. 22, 2017

(65) Prior Publication Data
US 2018/0138824 A1    May 17, 2018

Related U.S. Application Data

(60) Continuation of application No. 15/225,877, filed on Aug. 2, 2016, now Pat. No. 9,866,143, which is a
(Continued)

(30) Foreign Application Priority Data

Jun. 15, 2012    (JP) .................................. 2012-135431

(51) Int. Cl.
| | |
|---|---|
| *H02M 7/44* | (2006.01) |
| *H01L 29/43* | (2006.01) |
| *H01L 29/16* | (2006.01) |
| *H01L 29/78* | (2006.01) |
| *H01L 27/02* | (2006.01) |
| *H01L 29/417* | (2006.01) |
| *H01L 29/10* | (2006.01) |

(Continued)

(52) U.S. Cl.
CPC .......... *H02M 7/44* (2013.01); *H01L 27/0288* (2013.01); *H01L 29/1095* (2013.01);
(Continued)

(58) Field of Classification Search
CPC ............................... H01L 29/41725–29/41791
See application file for complete search history.

(56) References Cited

U.S. PATENT DOCUMENTS

| | | |
|---|---|---|
| 5,831,287 A | 11/1998 | Bakowski et al. |
| 6,136,639 A | 10/2000 | Seon |
| | (Continued) | |

FOREIGN PATENT DOCUMENTS

| | | |
|---|---|---|
| JP | S61-08058 A | 4/1986 |
| JP | H05-121746 A | 5/1993 |
| | (Continued) | |

OTHER PUBLICATIONS

Japanese Office Action dated Aug. 18, 2016 for corresponding Japanese Application No. 2012-135431.

*Primary Examiner* — Mohammed R Alam
(74) *Attorney, Agent, or Firm* — Gregory M. Howison

(57) ABSTRACT

A switching device according to the present invention is a switching device for switching a load by on-off control of voltage, and includes an SiC semiconductor layer where a current path is formed by on-control of the voltage, a first electrode arranged to be in contact with the SiC semiconductor layer, and a second electrode arranged to be in contact with the SiC semiconductor layer for conducting with the first electrode due to the formation of the current path, while the first electrode has a variable resistance portion made of a material whose resistance value increases under a prescribed high-temperature condition for limiting current density of overcurrent to not more than a prescribed value when the overcurrent flows to the current path.

21 Claims, 6 Drawing Sheets

Related U.S. Application Data division of application No. 14/804,920, filed on Jul. 21, 2015, now Pat. No. 9,437,592, which is a division of application No. 13/917,998, filed on Jun. 14, 2013, now Pat. No. 9,117,800.

(51) Int. Cl.
*H01L 29/45* (2006.01)
*H01L 29/423* (2006.01)

(52) U.S. Cl.
CPC .... *H01L 29/1608* (2013.01); *H01L 29/41766* (2013.01); *H01L 29/4236* (2013.01); *H01L 29/435* (2013.01); *H01L 29/456* (2013.01); *H01L 29/78* (2013.01); *H01L 29/7803* (2013.01); *H01L 29/7813* (2013.01); *H01L 29/42368* (2013.01)

(56) References Cited

U.S. PATENT DOCUMENTS

| | | | |
|---|---|---|---|
| 6,542,067 B1 | 4/2003 | Kawamoto | |
| 8,283,721 B2 | 10/2012 | Nakano | |
| 2005/0062048 A1* | 3/2005 | Hayashi | H01L 29/66068 257/77 |
| 2005/0093000 A1 | 5/2005 | Tanimoto et al. | |
| 2009/0294802 A1 | 12/2009 | Simin et al. | |
| 2010/0025759 A1* | 2/2010 | Yoshimochi | H01L 29/7813 257/330 |
| 2010/0102332 A1* | 4/2010 | Takahashi | H01L 21/0485 257/77 |
| 2010/0176755 A1* | 7/2010 | Hoadley | H02M 5/14 318/105 |
| 2010/0270586 A1 | 10/2010 | Ueno | |
| 2012/0217513 A1 | 8/2012 | Tega et al. | |
| 2013/0126904 A1 | 5/2013 | Masuda et al. | |

FOREIGN PATENT DOCUMENTS

| | | |
|---|---|---|
| JP | H09-008052 A | 1/1997 |
| JP | 2000-516402 A | 12/2000 |
| JP | 2007-258465 A | 10/2007 |
| JP | 2009-260253 A | 11/2009 |
| JP | 2010-258328 A | 11/2010 |
| JP | 2011-159797 A | 8/2011 |
| JP | 2012-100432 A | 5/2012 |

\* cited by examiner

SWITCHING DEVICE

CROSS-REFERENCE TO RELATED APPLICATIONS

This application is a continuation of U.S. application Ser. No. 15/225,877, filed on Aug. 2, 2016, and allowed on Sep. 8, 2017, which is a divisional of U.S. application Ser. No. 14/804,920, filed on Jul. 21, 2015, and issued as U.S. Pat. No. 9,437,592 on Sep. 6, 2016, which was divisional of U.S. application Ser. No. 13/917,998, filed on Jun. 14, 2013, and issued as U.S. Pat. No. 9,117,800 on Aug. 25, 2015, and claims the benefit of priority of Japanese application 2012-135431, filed on Jun. 15, 2012. The disclosures of these prior U.S. and foreign applications are incorporated herein by reference.

BACKGROUND OF THE INVENTION

Field of the Invention

The present invention relates to a switching device using SiC.

Description of Related Art

In general, a semiconductor power device mainly used for a system such as a motor control system or a power conversion system in the power electronics field is watched with interest.

For example, an SiC semiconductor device is well-known as such a type of semiconductor power device (Patent Document 1: Japanese Unexamined Patent Publication No. 2007-258465).

SUMMARY OF THE INVENTION

An object of the present invention is to provide a switching device capable of preventing thermal destruction resulting from a continuous flow of overcurrent.

DETAILED DESCRIPTION OF THE EMBODIMENTS

Figure 1:
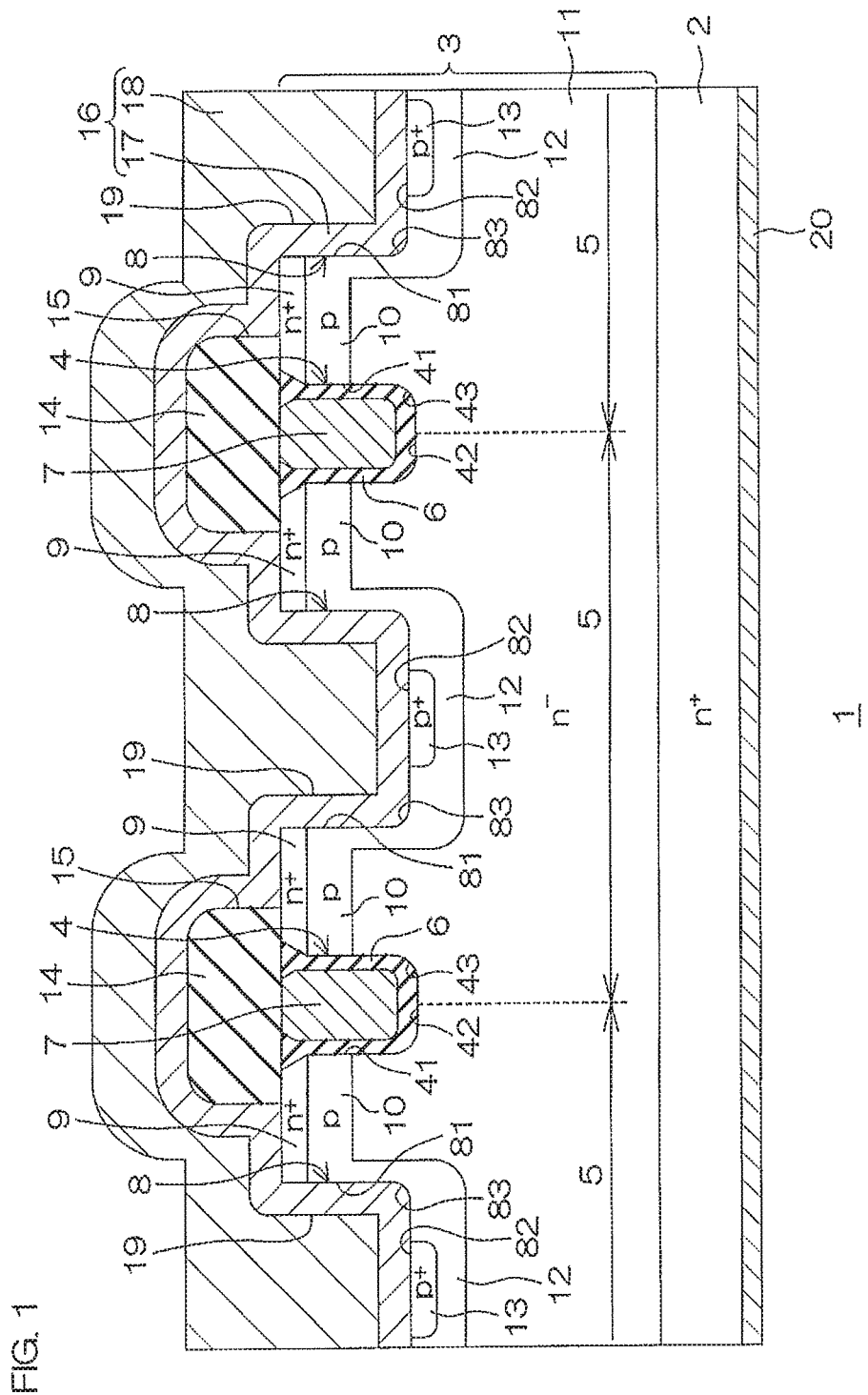
FIG. 1 is a schematic sectional view of a switching device according to a first embodiment of the present invention.

A switching device according to the present invention is a switching device for switching a load by on-off control of voltage, and includes an SiC semiconductor layer where a current path is formed by on-control of the voltage, a first electrode arranged to be in contact with the SiC semiconductor layer, and a second electrode arranged to be in contact with the SiC semiconductor layer for conducting with the first electrode due to the formation of the current path, while the first electrode has a variable resistance portion made of a material whose resistance value increases under a prescribed high-temperature condition for limiting current density of overcurrent to not more than a prescribed value when the overcurrent flows to the current path.

According to the structure, the resistance value of the variable resistance portion can be increased when overcurrent flows between the first electrode and the second electrode through the SiC semiconductor layer and the variable resistance portion is brought into a high-temperature condition due to heat generation resulting from the overcurrent. Such increase of the resistance value of the variable resistance portion reduces the density of the overcurrent flowing between the first electrode and the second electrode. Even if the first and second electrodes are short-circuited and overcurrent flows therebetween, therefore, the current density is reduced below the prescribed value as the time elapses. Consequently, the switching device can be prevented from thermal destruction resulting from a continuous flow of the overcurrent. In other words, short-circuit resistance of the switching device can be improved.

Preferably, the variable resistance portion is arranged closer to the SiC semiconductor layer with respect to a center of the first electrode in the thickness direction.

When heat occurs mainly in the SiC semiconductor layer due to the overcurrent, the generated heat can be more quickly transferred to the variable resistance portion due to the aforementioned structure. Therefore, a period up to a time when the resistance value of the variable resistance portion starts to increase can be reduced. Consequently, the density of the overcurrent can be reduced in a shorter time.

Preferably, the variable resistance portion is made of a conductive barium titanate-based compound.

Preferably, the variable resistance portion includes a high-resistance portion where a rate of increase of the resistance value under the prescribed high-temperature condition is relatively high and a low-resistance portion where the rate of increase is lower than that in the high-resistance portion, and the high-resistance portion is smaller in thickness than the low-resistance portion, and arranged closer to the SiC semiconductor layer with respect to the low-resistance portion.

According to the structure, the low-resistance portion is provided on the variable resistance portion, and the high-resistance portion is thinly formed. Even if the variable resistance portion is exposed to a high temperature in ordinary use, therefore, the resistance value of the whole variable resistance portion can be prevented from excessive increase. Upon a short circuit, on the other hand, the high-resistance portion of the variable resistance portion can take the lead in excellently sufficiently reducing the density of the overcurrent. In other words, a switching device capable of excellently reducing the density of overcurrent while suppressing increase of on-resistance can be provided.

Preferably, the variable resistance portion limits the density of the overcurrent to not more than 2000 A/cm$^2$ within 2 μsec from a time when the overcurrent starts flowing to the current path.

The variable resistance portion may be in contact with the SiC semiconductor layer.

When heat occurs mainly in the SiC semiconductor layer due to the overcurrent, the generated heat can be directly transferred to the variable resistance portion due to the aforementioned structure.

When the variable resistance portion is selectively in contact with the SiC semiconductor layer, the first electrode may include a contact portion in contact with the SiC semiconductor layer on a portion different from the variable resistance portion.

The first electrode may include a contact portion arranged between the variable resistance portion and the SiC semiconductor layer to be in contact with the SiC semiconductor layer.

According to the structure, the first electrode can be excellently brought into ohmic contact with the SiC semiconductor layer. Preferably in this case, the thickness of the contact portion is not more than 1 μm.

The switching device may have a MIS transistor structure including a gate insulating film formed in contact with the SiC semiconductor layer and a gate electrode arranged on the gate insulating film, and the current path may be formed in the vicinity of the interface between the SiC semiconductor layer and the gate insulating film by on-off control of voltage to the gate electrode.

Even if there is a time lag between start of a short circuit of the switching device and recovery from the short circuit by off-control of a gate (cutoff control of the current path), for example, the density of the overcurrent can be sufficiently reduced before the recovery from the short circuit due to the aforementioned structure.

The MIS transistor structure may include a trench gate structure including a gate trench formed in the SiC semiconductor layer so that the gate electrode is embedded in the gate trench through the gate insulating film.

In the case of the trench gate structure, channel resistance and on-resistance tend to be smaller and lower respectively, as compared with those of a planar gate structure. The density of overcurrent is easily increased in a device having low on-resistance, and hence it is difficult for the device to withstand the overcurrent over a long period of time, and the device may be thermally destroyed between start of a short circuit and recovery from the short circuit. When the variable resistance portion is provided on the first electrode as in the present invention, therefore, the MIS transistor of the trench gate structure can also be excellently prevented from thermal destruction.

When the SiC semiconductor layer includes a source layer formed to be exposed on a front surface of the SiC semiconductor layer for partially forming a side surface of the gate trench, the first electrode may include a source electrode in contact with the source layer.

When the switching device further includes a source trench formed to pass through the source layer from the front surface of the SiC semiconductor layer, the variable resistance portion is preferably formed to enter the source trench.

When heat occurs mainly in the SiC semiconductor layer due to the overcurrent, the distance between a main heat generation region and the variable resistance portion is shortened due to the aforementioned structure. Consequently, the heat generated in the heat generation region can be efficiently transferred to the variable resistance portion.

Embodiments of the present invention are now described in detail with reference to the attached drawings.

FIG. 1 is a schematic sectional view of a switching device according to a first embodiment of the present invention.

A switching device 1 includes a trench gate MISFET (Metal Insulator Semiconductor Field-Effect Transistor) employing SiC. The switching device 1 includes an SiC substrate 2 and an SiC epitaxial layer 3 formed on the SiC substrate 2. Each of the SiC substrate 2 and the SiC epitaxial layer 3 is of an n-type as a first conductivity type. More specifically, the SiC substrate 2 is of an n+-type (having a concentration of $1.0 \times 10^{18}$ cm$^{-3}$ to $1.0 \times 10^{21}$ cm$^{-3}$, for example), and the SiC epitaxial layer 3 is of an n−-type (having a concentration of $1.0 \times 10^{15}$ cm$^{-3}$ to $1.0 \times 10^{17}$ cm$^{-3}$, for example) lower in concentration than the SiC substrate 2. The first embodiment shows the SiC substrate 2 and the SiC epitaxial layer 3 as examples of the SiC semiconductor layer according to the present invention.

According to the first embodiment, the thickness of the SiC substrate 2 is 30 μm to 400 μm, for example. On the other hand, the thickness of the SiC epitaxial layer 3 is 3 μm to 100 μm, for example, according to the first embodiment.

The SiC epitaxial layer 3 is provided with gate trenches 4. According to the first embodiment, the gate trenches 4 are formed in a latticed manner, for example. Alternatively, the gate trenches 4 may be formed in a striped manner or in a honeycomb manner.

According to the first embodiment, the latticed gate trenches 4 are so formed that the SiC epitaxial layer 3 is provided with a plurality of unit cells 5 on window portions surrounded by the gate trenches 4.

The gate trenches 4 are formed to be U-shaped in section, so that corner portions 43 where side surfaces 41 and bottom surfaces 42 intersect with one another are curved. The gate trenches 4 are formed by forming the outer shapes thereof by dry-etching the SiC epitaxial layer 3 and thereafter wet-etching inner surfaces thereof, for example. Thus, planarity of the side surfaces 41 of the gate trenches 4 can be improved. Consequently, collision between electrons can be reduced when current flows along the side surfaces 41 of the gate trenches 41, whereby channel mobility can be increased.

Gate insulating films 6 made of an insulating material such as $SiO_2$ are formed on the inner surfaces (the side surfaces 41, the bottom surfaces 42 and the corner portions 43) of the gate trenches 4, to cover the whole areas thereof.

Gate electrodes 7 made of a conductive material such as polysilicon are embedded in the gate trenches 4. The gate electrodes 7 are opposed to the SiC epitaxial layer 3 through the gate insulating films 6.

Source trenches 8 are formed on central portions of the unit cells 5. According to the first embodiment, the source trenches 8 are identical in depth to the gate trenches 4. The source trenches 8 are also formed to be U-shaped in section similarly to the gate trenches 4, so that corner portions 83 where side surfaces 81 and bottom surfaces 82 intersect with one another are curved.

Source layers 9, channel layers 10 and a drift layer 11 are formed on the unit cells 5 successively from a front surface of the SiC epitaxial layer 3 toward a rear surface thereof, and the layers 9 to 11 are in contact with one another. Thus, the source layers 9 and the drift layer 11 are arranged in the vertical direction perpendicular to the front surface of the SiC epitaxial layer 3 to be separated from one another through the channel layers 10, thereby constituting a trench gate MIS transistor structure. The source layers 9 and the drift layer 11 are of the n-type as the first conductivity type, and the channel layers 10 are of a p-type as a second conductivity type. More specifically, the source layers 9 are of the n+-type (having the concentration of $1.0 \times 10^{18}$ cm$^{-3}$ to $1.0 \times 10^{21}$ cm$^{-3}$, for example), the channel layers 10 are of the p-type (having a concentration of $1.0 \times 10^{16}$ cm$^{-3}$ to $1.0 \times 10^{19}$ cm$^{-3}$, for example), and the drift layer 11 is of the n−-type (having the concentration of $1.0 \times 10^{15}$ cm$^{-3}$ to $1.0 \times 10^{17}$ cm$^{-3}$, for example) lower in concentration than the source layers 9.

The source layers 9 partially form the side surfaces 41 of the gate trenches 4 and the side surfaces 81 of the source trenches 8. The channel layers 10 also partially form the side surfaces 41 of the gate trenches 4 and the side surfaces 81 of the source trenches 8, similarly to the source layers 9. The drift layer 11 forms the corner portions 43 and the bottom surfaces 42 of the gate trenches 4 as well as the corner portions 83 and the bottom surfaces 82 of the source trenches 8.

Source breakdown voltage holding layers 12 are formed on the SiC epitaxial layer 3. The source breakdown voltage holding layers 12 are of the p type (having the concentration of $1.0 \times 10^{16}$ cm$^{-3}$ to $1.0 \times 10^{19}$ cm$^{-3}$, for example) as the second conductivity type.

The source breakdown voltage holding layers 12 are formed to reach the channel layers 10 immediately above the corner portions 83 from the bottom surfaces 82 of the source trenches 8 through the corner portions 83 thereof.

On the bottom surfaces 82 of the source trenches 8, channel contact layers 13 are formed on surface layer portions of the source breakdown voltage holding layers 12. The channel contact layers 13 are of the p type as the second conductivity type. More specifically, the channel contact layers 13 are of a p$^+$-type (having an impurity concentration of $1.0 \times 10^{18}$ cm$^{-3}$ to $2.0 \times 10^{21}$ cm$^{-3}$, for example).

An interlayer film 14 made of an insulating material such as SiO$_2$ is formed on the SiC epitaxial layer 3, to cover the gate electrodes 7.

Contact holes 15 larger in diameter than the source trenches 8 are formed in the interlayer film 14. Thus, the whole of the source trenches 8 of the unit cells 5 and peripheral edge portions of the source trenches 8 of the SiC epitaxial layer 3 are exposed in the contact holes 15. Upper surfaces and side surfaces of the source layers 9 are exposed on the peripheral edge portions.

A source electrode 16 as an example of the first electrode according to the present invention is formed on the interlayer film 14. The source electrode 16 includes a variable resistance layer 17 and a surface electrode layer 18 stacked successively from the SiC epitaxial layer 3.

According to the first embodiment, the variable resistance layer 17 is made of a conductive barium titanate-based compound. The barium titanate-based compound can be obtained by adding a small amount of an alkaline earth metal such as calcium (Ca) or strontium (Sr) or a rare earth metal such as yttrium (Y), neodymium (Nd), samarium (Sm) or dysprosium (Dy) to barium titanate as a main component, for example. Such a conductive barium titanate-based compound is a conductive material sensing that the same has been brought into a prescribed high-temperature condition and having a resistance value increasing along with temperature rise.

The variable resistance layer 17 is formed by a single-layer structure of a prescribed thickness, and arranged to follow (to be along) the side surfaces 81 and the bottom surfaces 82 of the source trenches 8. According to the first embodiment, the thickness of the variable resistance layer 17 is 0.5 µm to 2 µm, for example. Thus, spaces 19 surrounded by the variable resistance layer 17 are formed in the source trenches 8. The variable resistance layer 17 is in contact with the whole areas of the SiC epitaxial layer 3 exposed from the contact holes 15. More specifically, the variable resistance layer 17 is in contact with the channel contact layers 13, the source breakdown voltage holding layers 12, the channel layers 10 and the source layers 9 successively from the bottoms of the source trenches 8 in the unit cells 5.

According to the first embodiment, the surface electrode layer 18 has a structure (Ti/TiN/Al) obtained by stacking titanium (Ti), titanium nitride (TiN) and aluminum (Al) successively from the side in contact with the variable resistance layer 17. The surface electrode layer 18 is arranged to fill up the spaces 19 in the source trenches 8.

A drain electrode 20 as an example of the second electrode according to the present invention is formed on the rear surface of the SiC substrate 2. According to the first embodiment, the drain electrode 20 has a structure (Ti/Ni/Au/Ag) obtained by stacking titanium (Ti), nickel (Ni), gold (Au) and silver (Ag) successively from the SiC substrate 2. The drain electrode 20 covers the whole area of the rear surface of the SiC substrate 2. In other words, the drain electrode 20 is common to all unit cells 5.

According to the switching device 1, a state of applying no voltage to the gate electrodes 7 is continued (off-control) so that the p-type channel layers 10 electrically insulate the n-type source layers 9 and the n-type drift layer 11 from one another. In other words, no current path is formed between a source and a drain, but the switching device 1 enters a switch-off state. When voltage exceeding threshold voltage is applied to the gate electrodes 7 while drain voltage is applied between the source layers 9 and the drift layer 11 (on-control), on the other hand, current paths (channels) vertically feeding current along the side surfaces 41 of the gate trenches 4 are formed on the channel layers 10. This corresponds to a switch-on state.

Figure 2:
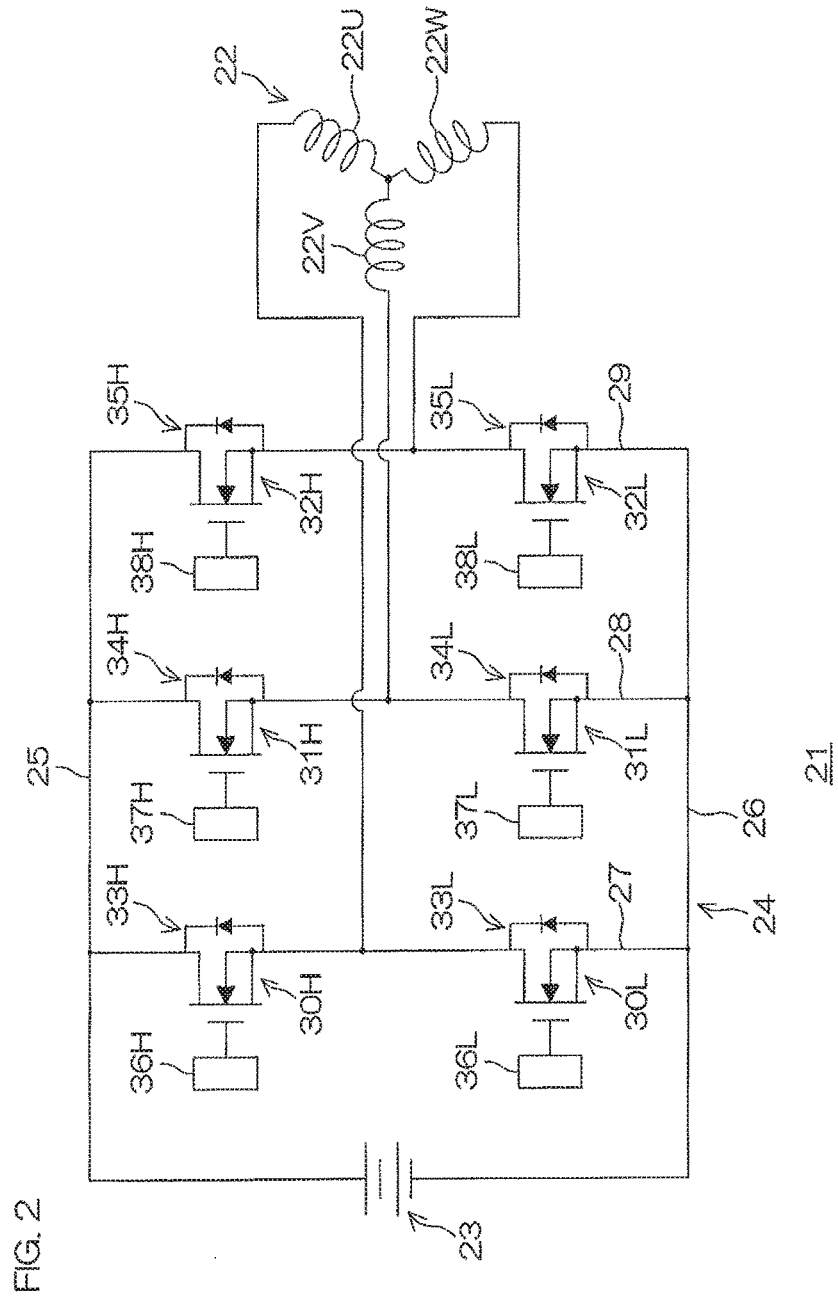
FIG. 2 illustrates an inverter circuit into which the switching device is incorporated.
Figure 3A:
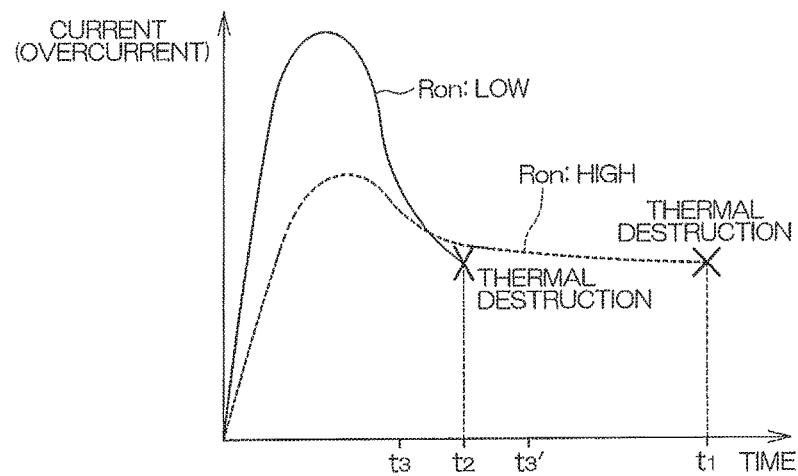
FIGS. 3A and 3B illustrate waveforms of drain current Id upon short circuits of devices.
Figure 3B:
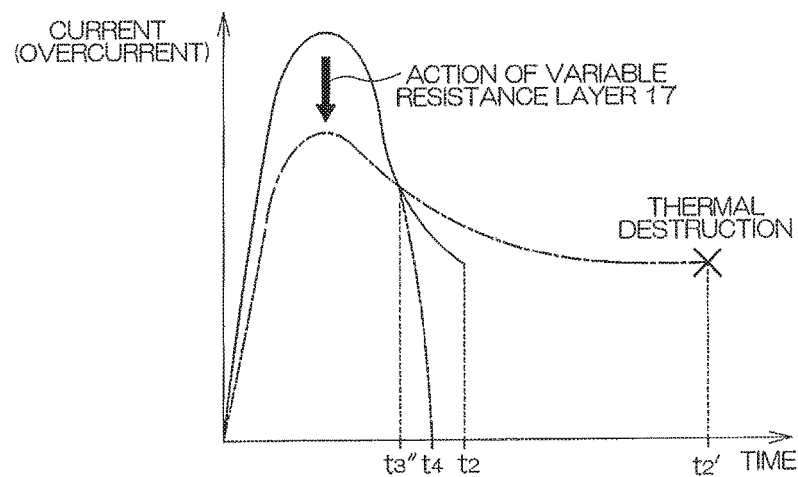

The switching device 1 can be incorporated into an inverter circuit shown in FIG. 2, for example. FIG. 2 illustrates the inverter circuit into which the switching device 1 is incorporated. FIGS. 3A and 3B illustrate waveforms of drain current Id upon short circuits of devices.

An inverter circuit 21 is a three-phase inverter circuit connected to a three-phase motor 22 as an example of a load. The inverter circuit 21 includes a DC power source 23 and a switch portion 24.

According to the first embodiment, the DC power source 23 is 700 V, for example. A high-voltage-side wire 25 and a low-voltage-side wire 26 are connected to a high-voltage side and a low-voltage side of the DC power source 23 respectively.

The switch portion 24 includes three arms 27 to 29 corresponding to a U-phase 22U, a V-phase 22V and a W-phase 22W of the three-phase motor 22 respectively.

The arms 27 to 29 are parallelly connected between the high-voltage-side wire 25 and the low-voltage-side wire 26. The arms 27 to 29 include high-side transistors (the switching device 1) 30H to 32H and low-side transistors (the switching device 1) 30L to 32L respectively. Regenerative diodes 33H to 35H and 33L to 35L are parallelly connected to the transistors 30H to 32H and 30L to 32L respectively in such a direction that forward current flows from the low-voltage side toward the high-voltage side.

High-side gate drivers 36H to 38H and low-side gate drivers 36L to 38L are connected to the gates of the transistors 30H to 32H and 30L to 32L respectively.

In the inverter circuit 21, AC current can be fed to the three-phase motor 22 by alternately switching on-off control of the high-side transistors 30H to 32H and the low-side transistors 30L to 32L of the arms 27 to 29, i.e., by alternately switching a state where either the high-side transistors 30H to 32H or the low-side transistors 30L to 32L are switched on and either the low-side transistors 30L to 32L or the high-side transistors 30H to 32H are switched off. On the other hand, energization to the three-phase motor 22 can be stopped by bringing all transistors 30H to 32H and 30L to 32L into switch-off states. The three-phase motor 22 is switched in this manner.

In a general inverter circuit, noise generated therein may be superposed at a timing when a switching control signal is switched from a low side to a high side or vice versa, to exceed threshold voltage of a transistor. Referring to the inverter circuit 21 shown in FIG. 2, for example, a transistor (the low-side transistor 30L, for example) to be originally in a switch-off state malfunctions to enter a switch-on state. At this time, the high-side transistor 30H of the arm 27 is in a switch-on state, and hence both of the high side and the low side enter switch-on states to result in a short circuit (arm short).

High voltage (700 V, for example) is applied between the high-voltage-side wire 25 and the low-voltage-side wire 26 at the time of the arm short, and hence overcurrent (the drain current Id) exceeding a rated value (100 A, for example) flows to the malfunctioning low-side transistor 30L. In a device (a high on-resistance device) such as an Si device having high on-resistance $R_{on}$, resistance increases and current decreases as the time elapses when the device (mainly an SiC epitaxial layer 3) generates heat due to overcurrent as shown in FIG. 3A, for example, while such increase of the resistance results from the heat generation of the device. Therefore, the heat generation is not stopped even if the current apparently decreases, and the device is thermally destroyed at a time $t_1$, for example, when the same is left as such. In a device (a low on-resistance device) such as an SiC device having low on-resistance $R_{on}$, on the other hand, higher overcurrent flows in a short time as compared with the high on-resistance device, and hence the heat of the device abruptly rises to a high temperature. Therefore, the low on-resistance device is thermally destroyed in a shorter time ($t_2<t_1$, for example) as compared with the high on-resistance device.

According to the first embodiment, therefore, the low-side gate driver 36L senses overcurrent when the overcurrent flows to the switching device 1, to off-control the gate. In relation to the off control of the gate, a short circuit sensing period of about 1 μsec. is provided in order to prevent a malfunction caused by noise or the like. In other words, the low-side gate driver 36L off-controls the gate and reduces gate voltage $V_g$ only after sensing that the overcurrent still flows after a lapse of the short circuit sensing period. In the low on-resistance device, however, the time $t_2$ up to thermal destruction is so extremely short that the switching device 1 cannot be prevented from thermal destruction if the short circuit sensing period (a short circuit sensing period $t_3'$, for example) is longer than the time $t_2$, although no problem arises when the short circuit sensing period (a short circuit sensing period $t_3$, for example) is shorter than the time $t_2$.

In the switching device 1 according to the first embodiment, the source electrode 16 includes the variable resistance layer 17, as shown in FIG. 1. When the variable resistance layer 17 is brought into a high-temperature condition due to heat generation in the SiC epitaxial layer 3 resulting from overcurrent, therefore, the resistance value of the variable resistance layer 17 can be increased. Consequently, peak overcurrent can be reduced due to action of the variable resistance layer 17, as shown by broken lines in FIG. 3B. Thus, abrupt temperature increase in the switching device 1 can be prevented, whereby the time up to thermal destruction can be extended from $t_2$ to $t_2'$ ($>t_2$). In other words, short-circuit resistance can be improved. While the switching device 1 is thermally destroyed at the time $t_2'$ if overcurrent is left as such also in this case, a short circuit sensing period $t_3''$ can be reliably reduced below the time $t_2'$ up to thermal destruction due to a longer temporal allowance as compared with a conventional low on-resistance device. Consequently, the low-side gate driver 36L can off-control the gate to reduce the gate voltage $V_g$ after a lapse of the time $t_3''$ with a sufficient allowance, for turning off current at a time $t_4$.

Particularly in the case of a trench gate structure such as that of the switching device 1 according to the first embodiment, channel resistance and on-resistance tend to be smaller and lower respectively, as compared with those of a planar gate structure. The density of overcurrent is easily increased in a low on-resistance device, and hence it is difficult for the switching device 1 to withstand the overcurrent over a long period of time, and the switching device 1 is easily thermally destroyed between start of a short circuit and recovery from the short circuit. Therefore, the structure of the variable resistance layer 17 according to the first embodiment exhibits a particularly excellent effect of preventing the switching device 1 of the trench gate structure from thermal destruction.

According to the first embodiment, further, the variable resistance layer 17 is arranged to be in contact with the SiC epitaxial layer 3, whereby heat generated in the SiC epitaxial layer 3 due to the overcurrent can be directly transferred to the variable resistance layer 17. Therefore, a period up to a time when the resistance value of the variable resistance layer 17 starts to increase can be reduced. Consequently, the density of the overcurrent can be reduced in a shorter time.

Main heat generation regions of the switching device 1 having the trench gate structure are positioned immediately under the gate trenches 4 where current paths are formed. According to the first embodiment, the variable resistance layer 17 is arranged to enter the source trenches 8 dug down from the front surface of the SiC epitaxial layer 3 and to follow the side surfaces 81 and the bottom surfaces 82. Thus, the distance between the variable resistance layer 17 and the main heat generation regions is shortened. Consequently, heat generated in the heat generation regions can be efficiently transferred to the variable resistance layer 17.

Figure 4:
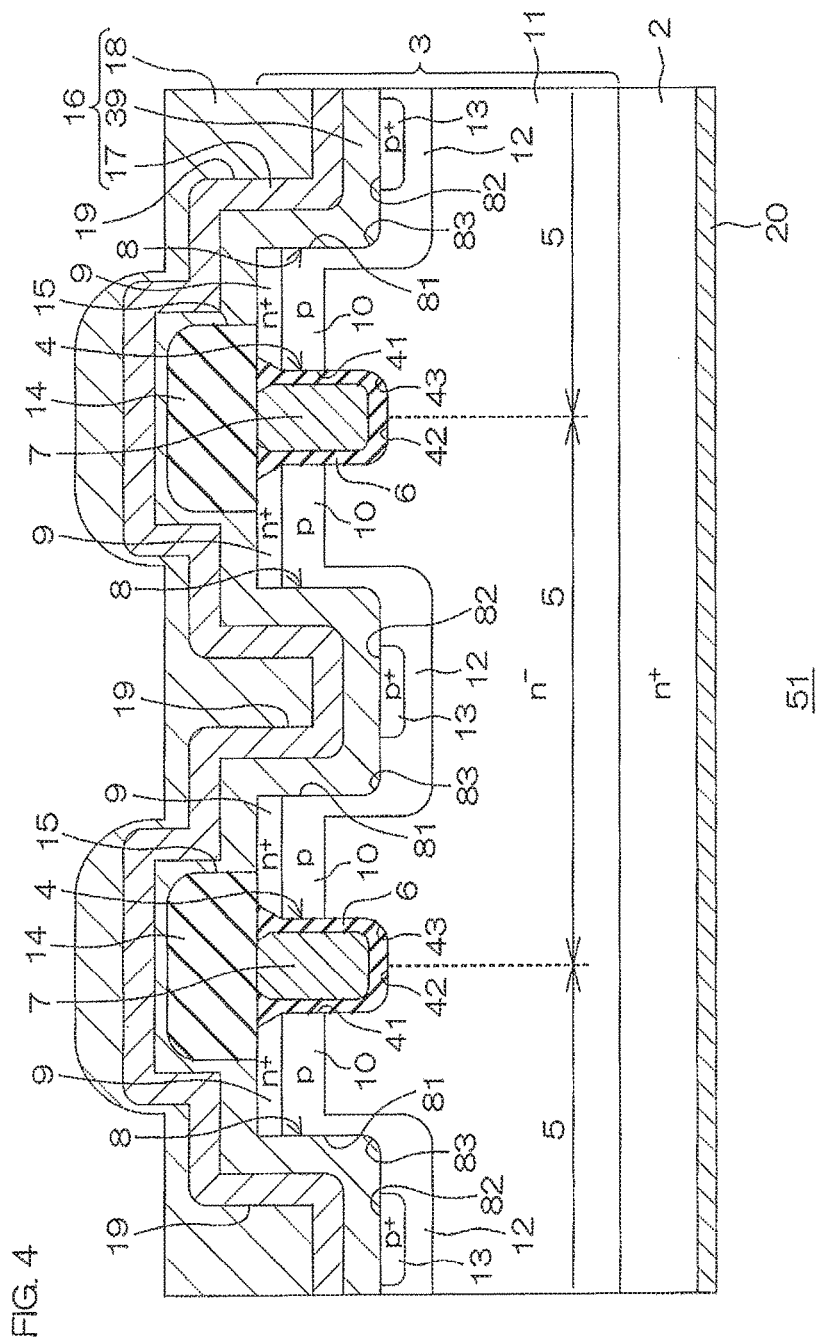
FIG. 4 is a schematic sectional view of a switching device according to a second embodiment of the present invention.

FIG. 4 is a schematic sectional view of a switching device according to a second embodiment of the present invention. Referring to FIG. 4, portions corresponding to those shown in FIG. 1 are denoted by the same reference numerals.

In a switching device 51 according to the second embodiment, a source electrode 16 further includes a contact layer 39 arranged between a variable resistance layer 17 and an SiC epitaxial layer 3 to be in contact with the SiC epitaxial layer 3.

The contact layer 39 is made of a metal forming ohmic contact between the same and the SiC epitaxial layer 3. According to the second embodiment, the contact layer 39 is made of Ti/TiN/Al, for example. The contact layer 39 has a thickness of not more than 1 μm, and preferably has a thickness of 0.5 μm to 1 μm.

According to the switching device 51, the source electrode 16 is in contact with the SiC epitaxial layer 3 on the contact layer 39, whereby the former can be excellently brought into ohmic contact with the latter. Further, the switching device 51 can attain effects similar to those of the switching device 1, as a matter of course.

Figure 5:
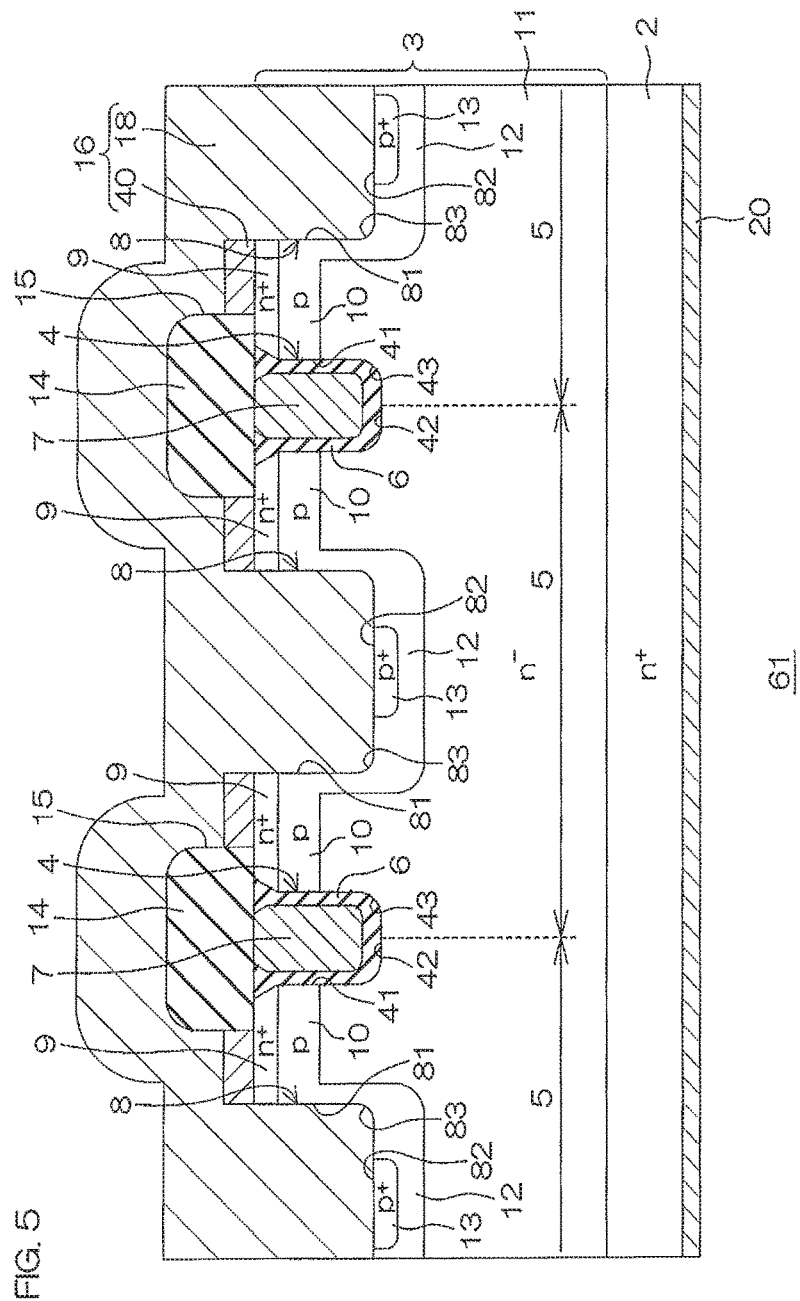
FIG. 5 is a schematic sectional view of a switching device according to a third embodiment of the present invention.

FIG. 5 is a schematic sectional view of a switching device according to a third embodiment of the present invention. Referring to FIG. 5, portions corresponding to those shown in FIG. 1 are denoted by the same reference numerals.

In a switching device 61 according to the third embodiment, a source electrode 16 includes a variable resistance layer 40 selectively in contact with an SiC epitaxial layer 3, in place of the variable resistance layer 17 in contact with the whole areas of the SiC epitaxial layer 3 exposed from the contact holes 15.

According to the third embodiment, the variable resistance layer 40 is in contact with peripheral edge portions of source trenches 8 (more specifically, upper surfaces of source layers 9) exposed from contact holes 15. Thus, the variable resistance layer 40 is not in contact with side surfaces 81 and bottom surfaces 82 of the source trenches 8, but a surface electrode layer 18 filling up the source trenches 8 is arranged to be in contact with the side surfaces 81 and the bottom surfaces 82. In other words, the surface electrode layer 18 serves as a contact portion in contact with an SiC epitaxial layer 3 according to the third embodiment.

The switching device 61 can also attain effects similar to those of the switching device 1.

The variable resistance layer 40 may alternatively be selectively in contact with upper surfaces and side surfaces of the source layers 9, only the side surfaces 81 of the source trenches 8, or only the bottom surfaces 82 of the source trenches 8, for example.

Figure 6:
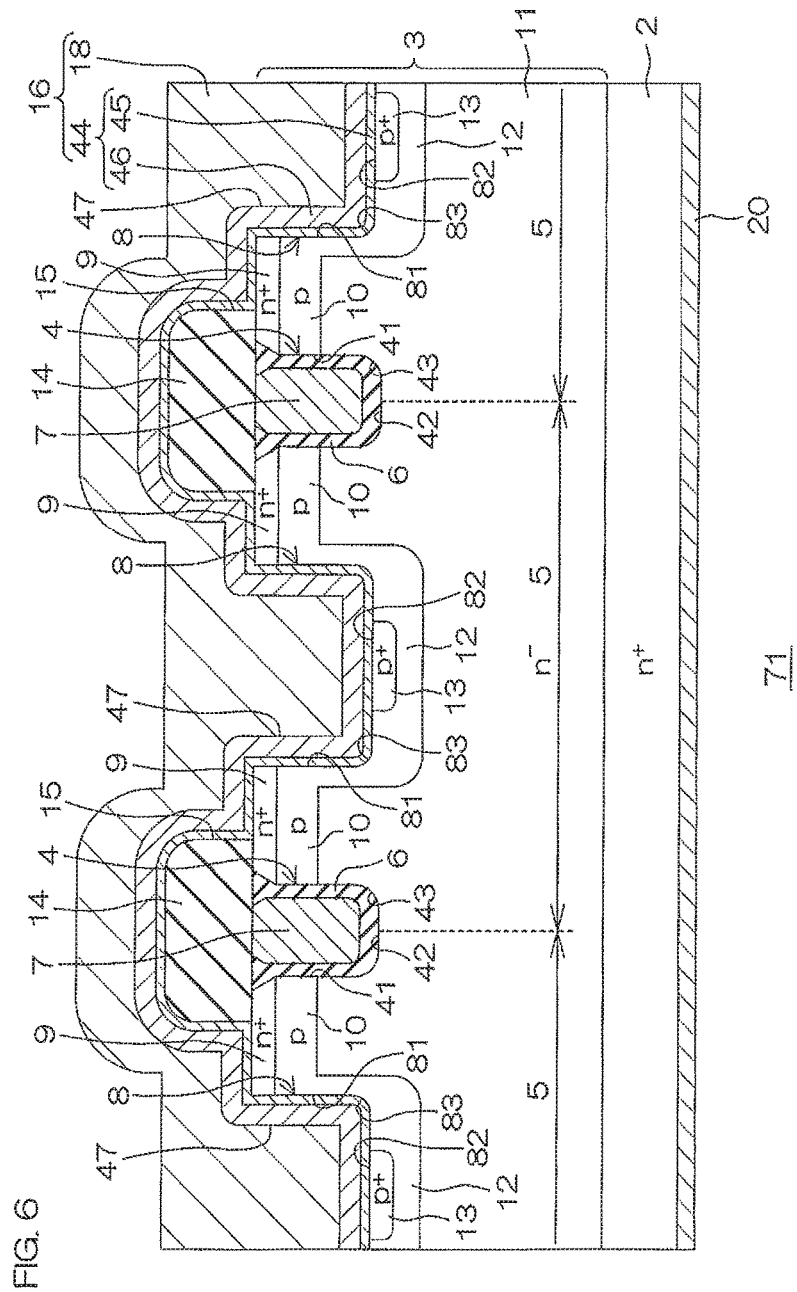
FIG. 6 is a schematic sectional view of a switching device according to a fourth embodiment of the present invention.

FIG. 6 is a schematic sectional view of a switching device according to a fourth embodiment of the present invention. Referring to FIG. 6, portions corresponding to those shown in FIG. 1 are denoted by the same reference numerals.

In a switching device 71 according to the fourth embodiment, a source electrode 16 includes a variable resistance layer 44 of a plurality-layer structure, in place of the variable resistance layer 17 of a single-layer structure.

The variable resistance layer 44 includes a high-resistance portion 45 where a rate of increase of a resistance value under a prescribed high-temperature condition (heat generation resulting from overcurrent, for example) is relatively high and a low-resistance portion 46 where the rate of increase is lower than that in the high-resistance portion 45.

The high-resistance portion 45 is smaller in thickness than the low-resistance portion 46, and arranged closer to the SiC epitaxial layer 3 with respect to the low-resistance portion 46. According to the fourth embodiment, the high-resistance portion 45 is arranged to follow (to be along) side surfaces 81 and bottom surfaces 82 of source trenches 8, and the low-resistance portion 46 is arranged on the high-resistance portion 45. Thus, spaces 47 surrounded by the variable resistance layer 44 are formed in the source trenches 8. The high-resistance portion 45 is in contact with the whole areas of the SiC epitaxial layer 3 exposed from contact holes 15. The thickness of the high-resistance portion 45 is 0.1 μm to 0.3 μm, for example, and the thickness of the low-resistance portion 46 is 0.5 μm to 1.0 μm, for example. A surface electrode layer 18 is arranged to fill up the spaces 47 in the source trenches 8.

According to the switching device 71, the low-resistance portion 46 is provided on the variable resistance layer 44 and the high-resistance portion 45 is thinly formed, whereby the resistance value of the whole variable resistance layer 44 can be prevented from excessive increase even if the variable resistance layer 44 is exposed to a high temperature in ordinary use. Upon a short circuit, on the other hand, the high-resistance portion 45 of the variable resistance layer 44 can take the lead in excellently sufficiently reducing the density of overcurrent. In other words, a switching device capable of excellently reducing the density of overcurrent while suppressing increase of on-resistance can be provided. The switching device 71 can also attain effects similar to those of the switching device 1, as a matter of course.

While four embodiments of the present invention have been described, the present invention can be embodied in other ways.

For example, the variable resistance layer 17, 40 or 44 may alternatively be made of a material other than the conductive barium titanate-based compound, so far as the same is a conductive material sensing that the same has been brought into a prescribed high-temperature condition and having a resistance value increasing along with temperature rise.

The variable resistance layer 17, 40 or 44 may alternatively be provided on the drain electrode 20. In this case, the source electrode 16 may also be provided with a variable resistance layer, or only the drain electrode 20 may be provided with the variable resistance layer 17, 40 or 44.

The conductivity types of the semiconductor portions of the switching device 1, 51, 61 or 71 may be inverted. For example, the p- and n-type portions of the switching device 1 may be replaced with n- and p-type portions respectively.

A functional element such as a planar gate MIS transistor or an insulated gate bipolar transistor (IGBT) may alternatively be formed on the switching device 1, 51, 61 or 71, in place of the trench gate MIS transistor.

The switching device according to the present invention can be incorporated into a power module employed for an inverter circuit constituting a driving circuit for driving an electric motor utilized as a power source for an electric car (including a hybrid car), an electric train, an industrial robot or the like, for example. The switching device according to the present invention can also be incorporated into a power module employed for an inverter circuit converting power generated by a power generator (particularly a private power generator) such as a solar cell or a wind turbine generator to match with power from a commercial power source.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

What is claimed is:

1. A wide band gap semiconductor device, comprising: a semiconductor layer having a first surface and a second surface opposed to the first surface; a first electrode arranged on the first surface of the semiconductor layer such that the first electrode is in contact with the first surface; a second electrode arranged on the second surface of the semiconductor layer such that the second electrode is in contact with the second surface and the second electrode is electrically connected to the first electrode when a current path is formed in the wide band gap semiconductor device; a gate trench formed at the first surface of the semiconductor layer, the first surface of the semiconductor layer located at a top end of the gate trench; a gate insulating film formed on an inner surface of the gate trench, a thickness of an end of the gate insulating film at the first surface of the semiconductor layer being larger than a thickness of the gate insulating film formed at a side wall of the gate trench between the end of the gate insulating film and a base of the gate trench, a third electrode formed in the gate trench for controlling the formation of the current path between the first electrode and the second electrode; and a thin electrode layer arranged between the first electrode and the semiconductor layer, the thin electrode layer including a titanate-based compound, wherein the gate trench is spread outward, in a cross-sectional view, at the first surface of the semiconductor layer.

2. The wide band gap semiconductor device according to claim 1, wherein the semiconductor layer includes an SiC semiconductor layer.

3. The wide band gap semiconductor device according to claim 1, wherein the semiconductor layer includes a source layer formed to be exposed on the first surface of the semiconductor layer for partially forming a side surface of the gate trench.

4. The wide band gap semiconductor device according to claim 3, wherein the semiconductor layer comprises a body contact region formed in the semiconductor layer to a predetermined depth from the first surface of the semiconductor layer.

5. The wide band gap semiconductor device according to claim 4, wherein
the body contact region includes an interface between the semiconductor layer and the thin electrode layer.

6. The wide band gap semiconductor device according to claim 5, wherein
a thickness of the interface is not more than 1 μm.

7. An inverter circuit using the wide band gap semiconductor device according to claim 1, wherein
the wide band gap semiconductor device is subordinately connected between a power-supply voltage provided from outside and a reference voltage, and
a voltage at a subordinate connection portion of the wide band gap semiconductor device is supplied as an output to a load.

8. A power module using a plurality of wide band gap semiconductor devices, each according to claim 1.

9. The wide band gap semiconductor device according to claim 5, wherein a highly doped P+ region is formed at the first surface of the semiconductor layer beneath the interface.

10. The wide band gap semiconductor device according to claim 9, wherein the semiconductor layer further comprises a drift layer beneath the source layer.

11. The wide band gap semiconductor device according to claim 10, wherein the gate trench extends into the drift layer.

12. The wide band gap semiconductor device according to claim 11, wherein a portion of the gate electrode at a depth corresponding to the drift layer has a constant width in a cross-sectional view.

13. The wide band gap semiconductor device according to claim 1, wherein the gate trench has a curved portion.

14. The wide band gap semiconductor device according to claim 13, wherein the inner surface of the gate trench has the curved portion.

15. The wide band gap semiconductor device according to claim 14, wherein the inner surface of the gate trench includes a side surface and bottom surface, and
the curved portion is formed between the side surface and the bottom surface.

16. The wide band gap semiconductor device according to claim 1, wherein the gate trench has an inclined edge portion.

17. The wide band gap semiconductor device according to claim 1, wherein the titanate-based compound extends to a depth beneath the first surface of the semiconductor layer,
a composition of the semiconductor layer beneath and on at least one side of the titanate-based compound is different than a composition of the titanate-based compound.

18. The wide band gap semiconductor device according to claim 1, wherein at least a portion of the gate trench is spread relative to the base of the gate trench, such that a width of an upper portion of the gate trench is greater, in a cross-sectional view, than a width of the base of the gate trench.

19. The wide band gap semiconductor device according to claim 1, wherein an impurity concentration of the semiconductor layer is between $10^{15}$ cm$^{-3}$ and $10^{17}$ cm$^{-3}$.

20. The wide band gap semiconductor device according to claim 3, wherein an impurity concentration of the source layer is between $10^{18}$ cm$^{-3}$ and $10^{21}$ cm$^{-3}$.

21. The wide band gap semiconductor device according to claim 3, wherein a thickness of the semiconductor layer is between 33 μm and 500 μm.

* * * * *